(12) United States Patent
Lau

(10) Patent No.: US 7,683,461 B2
(45) Date of Patent: Mar. 23, 2010

(54) INTEGRATED CIRCUIT LEADLESS PACKAGE SYSTEM

(75) Inventor: Keng Kiat Lau, Singapore (SG)

(73) Assignee: Stats Chippac Ltd., Singapore (SG)

( * ) Notice: Subject to any disclaimer, the term of this patent is extended or adjusted under 35 U.S.C. 154(b) by 109 days.

(21) Appl. No.: 11/459,320

(22) Filed: Jul. 21, 2006

(65) Prior Publication Data

US 2008/0096401 A1   Apr. 24, 2008

(51) Int. Cl.
*H01L 23/495* (2006.01)
*H01L 23/28* (2006.01)

(52) U.S. Cl. .................. 257/666; 257/784; 257/787; 257/E23.046; 438/123

(58) Field of Classification Search ............... 257/690, 257/666, 787, 784, E23.046, 78, E23.056; 438/123
See application file for complete search history.

(56) References Cited

U.S. PATENT DOCUMENTS

| 5,557,145 | A |   | 9/1996 | Kobayashi et al. | |
|---|---|---|---|---|---|
| 5,770,888 | A | * | 6/1998 | Song et al. | 257/696 |
| 6,198,171 | B1 | * | 3/2001 | Huang et al. | 257/787 |
| 6,211,462 | B1 | * | 4/2001 | Carter et al. | 174/522 |
| 6,399,415 | B1 | * | 6/2002 | Bayan et al. | 438/106 |
| 6,498,099 | B1 |   | 12/2002 | McLellan et al. | |
| 6,605,865 | B2 | * | 8/2003 | Jeong et al. | 257/670 |
| 6,696,749 | B1 |   | 2/2004 | Hung et al. | |
| 6,730,544 | B1 | * | 5/2004 | Yang | 438/110 |
| 6,815,806 | B1 |   | 11/2004 | Awad et al. | |
| 6,894,376 | B1 | * | 5/2005 | Mostafazadeh et al. | 257/684 |
| 6,924,548 | B2 |   | 8/2005 | Hasebe et al. | |
| 6,953,988 | B2 | * | 10/2005 | Seo et al. | 257/666 |
| 7,060,535 | B1 | * | 6/2006 | Sirinorakul et al. | 438/123 |
| 7,227,245 | B1 | * | 6/2007 | Bayan et al. | 257/666 |
| 7,375,416 | B2 | * | 5/2008 | Retuta et al. | 257/666 |

* cited by examiner

*Primary Examiner*—Nitin Parekh
(74) *Attorney, Agent, or Firm*—Mikio Ishimaru

(57) ABSTRACT

An integrated circuit leadless package system includes forming a lead, attaching an integrated circuit die to the lead, and applying an encapsulant including a thin encapsulant region with a thinner section over the lead than a section over the integrated circuit die.

16 Claims, 2 Drawing Sheets

INTEGRATED CIRCUIT LEADLESS PACKAGE SYSTEM

TECHNICAL FIELD

The present invention relates generally to package systems, and more particularly to a system for an integrated circuit leadless package.

BACKGROUND ART

Consumer and industry demands for more functions, lower cost, and smaller form factors have increased use of integrated circuits. Integrated circuits today are used in very small systems, such as cell phones, music players, and cameras, to very large systems, such as cars, airplanes, and industrial controls. Across virtually all applications, there continues to be demand for reducing the size and increasing performance of the devices. The intense demand is no more visible than in portable electronics that have become so ubiquitous.

Smaller integrated circuit devices require a smaller package, which both encases the circuit and provides electrical interconnection to external circuitry. A leadframe is one common means of electrical interconnection. The leadframe is formed from electrically conductive material, which is formed into leads. The lead ends close to the integrated circuit device connect to the integrated circuit device by thin bond wires. The lead ends opposite the integrated circuit device are electrically connected to external circuitry such as a printed circuit board.

To protect the integrated circuit device from moisture and mechanical damage, the lead ends close to the integrated circuits and the integrated circuit device are encapsulated. Encapsulation may be accomplished by a molding compound, which surrounds both the lead ends close the integrated circuits and the integrated circuit device. Alternatively, a separate base and cover can be used to form a package. When the base and cover are attached together, the lead ends close to the integrated circuits and integrated circuit device are encapsulated within the package. Manufacturing the package includes many processes that create destructive pressure on ever shrinking dimensions.

As the demand for smaller electronic devices grows, manufacturers are seeking ways to reduce the size of the packaged integrated circuits. To meet these needs, packaging technologies are shifting towards smaller footprints with higher numbers of leads. The leads are continually shrinking in size and spacing or lead gaps. With fine pitch configurations, the lead-to-lead gap will be reduced further. This will cause the lead plating to be susceptible to shorting during the processing particularly when the package is clamped. As lead pitch is reduced, strength of the leads is also reduced. Accordingly there is a possibility that the leads are deformed, having a direct effect on the reliability of the semiconductor device.

Small form factor packages or chip scale packages, such as bump chip carriers, land grid arrays, no-lead or leadless packages are particularly susceptible to narrow lead-to-lead gaps as well as reduced strength leads. Higher numbers of leads and smaller sizes have made lead formation and encapsulation extremely difficult. Many of the processing steps may deform the fragile leads resulting in missing, hard to reach or shorted connections. The missing, hard to reach or shorted connections typically render the integrated circuit device useless.

In many configurations of multi row leadless package, the multi row leads are exposed on a top side of a flange area of the leads, due to the etching method for fabrication. A plating covers the top flange area due to multi row leads that are exposed during a plating process. With a fine pitch configuration, the lead-to-lead gap will be reduced further. This in turn will cause the solder plating to be more susceptible to shorting during a singulation process when the flange area is clamped. The shorting caused by the plating of the top flange and the reduce lead-to-lead gap resulting in useless integrated circuit device, reduces performance, functions and manufacturing yields, thereby increasing costs, complexity and throughput.

Thus, a need still remains for an integrated circuit leadless package system to provide improved reliability and manufacturing yield. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit leadless package system, forming a lead, attaching an integrated circuit die to the lead, and applying an encapsulant including a thin encapsulant region with a thinner section over the lead than a section over the integrated circuit die.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
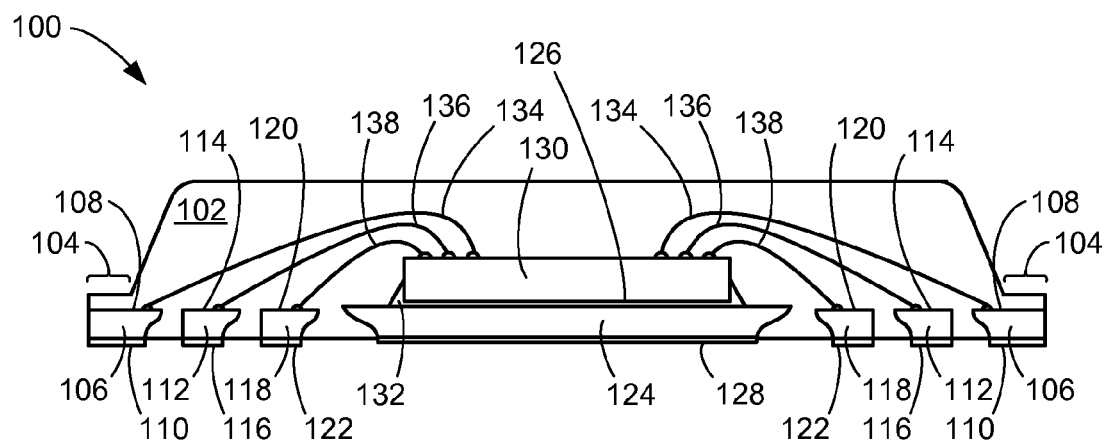
FIG. 1 is a cross-sectional view of an integrated circuit leadless package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. In addition, the same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes forming material, trimming, encapsulating, etching, stamping, bonding, mounting, reflowing, connecting, and/or removal of material as required in forming a described structure.

Referring now to FIG. 1, therein is shown a cross-sectional view of an integrated circuit leadless package system 100 in an embodiment of the present invention. The integrated circuit leadless package system 100 includes an encapsulant 102 including a thin encapsulant region 104. The thin encapsulant region 104 having a planar top surface covers and is substantially parallel to a part of a flange of row-one leads 106 on a row-one top surface 108. The row-one leads 106 also include a row-one bottom surface 110 for connection to a next level system such as a printed circuit board or another package. The row-one bottom surface 110 is exposed to provide electrical connectivity.

The encapsulant 102 further covers row-two leads 112 on a row-two top surface 114. The row-two leads 112 also include a row-two bottom surface 116 for connection to a next level system such as a printed circuit board or another package. The row-two bottom surface 116 is exposed to provide electrical connectivity. The encapsulant 102 yet further covers row-three leads 118 on a row-three top surface 120. The row-three leads 118 also include a row-three bottom surface 122 for connection to a next level system such as a printed circuit board or another package. The row-three bottom surface 122 is exposed to provide electrical connectivity. The row-three leads 118 can preferably include a curved inner edge in a shape of the letter "s". The curved inner edge can provide the row-three bottom surface 122 smaller than the row-three top surface 120. Similarly, the row-two leads 118 and the row-one leads can also be formed with the curved inner edge providing bottom surfaces smaller than top surfaces, respectively.

The integrated circuit leadless package system 100 also includes a die attach paddle 124 having a die pad top surface 126 and a die pad bottom surface 128. An integrated circuit die 130 is attached to the die attach paddle 124 by a die attach layer 132. The die attach paddle 124 may function as a heat sink to dissipate heat generated by the integrated circuit die 130. As such, the die attach paddle 124 may be soldered to the printed circuit board (not shown) to achieve greater heat dissipation through conduction.

The heat generated by the integrated circuit die 130 may transfer through the die attach layer 132 such as an epoxy, the die attach paddle 124, the solder (not shown) and the printed circuit board. As well as heat dissipation, the grounding of the integrated circuit die 130 can be done through the connection of a wire or connection from the integrated circuit die 130 to the die attach paddle 124. Further heat may be dissipated through row-three connections 138, row-two connections 136, and row-one connections 134. The row-three connections 138 are preferably formed nearest the die attach paddle 124, the row-two connections 136 preferably formed having a spacing from a side of the row-three connections 136 opposite the die attach paddle 124, and the row-one connections 134 formed at a side of the row-two connections 136 opposite the row-three connections and at a perimeter of the integrated circuit package system 100.

Each of the row-one leads 106 are connected from the row-one top surface 108 to the integrated circuit die 130 by the row-one connections 134, such as wire bonds. Similarly, each of the row-two leads 112 are connected from the row-two top surface 114 to the integrated circuit die 130 by the row-two connections 136, such as wire bonds. In a similar manner, each of the row-three leads 118 are connected from the row-three top surface 120 to the integrated circuit die 130 by the row-three connections 138, such as wire bonds. The encapsulant 102 is formed over the integrated circuit die 130 with a thickness greater than a thickness of the thin encapsulant region 104. The thin encapsulant region 104 provides a thinner section, such as a protective surface, over the row-one leads 106 than a section over the integrated circuit die 130, the row-two leads 112, or the row-three leads 118.

For illustrative purposes, the integrated circuit leadless package system 100 is shown with three rows of leads although it is understood that the integrated circuit leadless package system 100 may have any number of rows or leads. Further, for illustrative purposes the integrated circuit leadless package system 100 is shown with leads in rows although it is understood that the leads may be in other configuration such as staggered.

Figure 2:
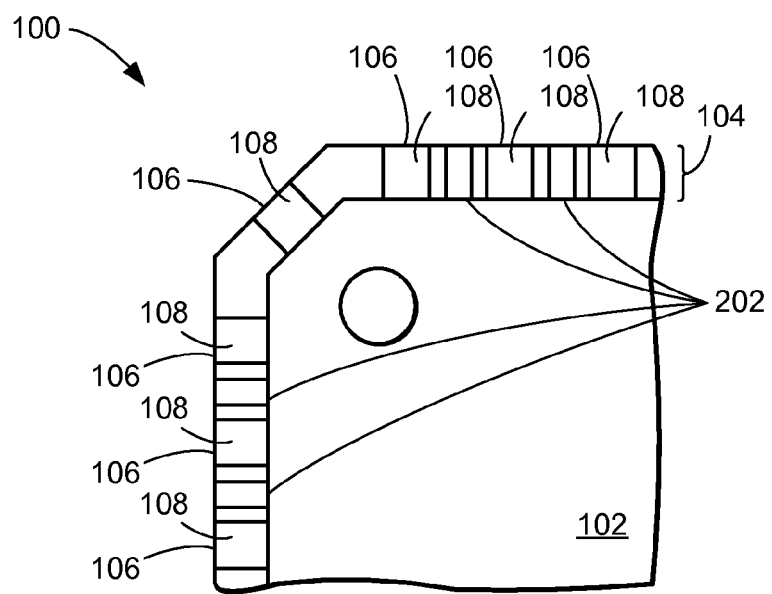
FIG. 2 is a top plan view of the integrated circuit leadless package system.

Referring now to FIG. 2, therein is shown a top plan view of the integrated circuit leadless package system 100. The integrated circuit leadless package system 100 includes the row-one leads 106 separated or singulated from a leadframe (not shown). A singulation process isolates the row-one leads 106, one from one another, to provide electrical isolation for each of the row-one leads 106 and lead extensions 202. The lead extensions 202 provide structure integrity to the row-two leads 112 and the row-three leads 118 during processing of the integrated circuit leadless package system 100.

The row-one leads 106, one to another, and the row-one leads 106 to the lead extensions 202 have improved spacing to provide an increased number of connections. The row-one leads 106 and the lead extensions 202 may include a plating (not shown), such as solder plating. The plating is susceptible during processing to deformation that causes solder bridging, including shorting. The improved spacing of the row-one leads 106, one to another, and the row-one leads 106 to the lead extensions 202 increases susceptibility to shorting of the plating. Solder bridging reduces performance, functions, and manufacturing yields, thereby increasing costs, complexity, and throughput.

The encapsulant 102 including the thin encapsulant region 104 protects the row-one leads 106 and the lead extensions 202 from deformation during processing of the integrated circuit leadless package system 100. The row-one top surface 108 of the row-one leads 106 as well as the row-two top surface 114 of FIG. 1 and the row-three top surface 120 of FIG. 1 of the lead extensions 202 are covered by the encapsulant 102 and the thin encapsulant region 104. The encapsulant 102 including the thin encapsulant region 104 provides electrical isolation including spacing between each of the row-one leads 106 as well as between the row-one leads 106 and the lead extensions 202. The row-one leads 106 and the lead extensions 202 are substantially undeformed by processing.

For illustrative purposes, the row-one leads 106 are shown next to the lead extensions 202 although it is understood that other configurations may be used. Further, for illustrative purposes the lead extensions 202 are shown although the lead extensions 202 are optional.

Figure 3:
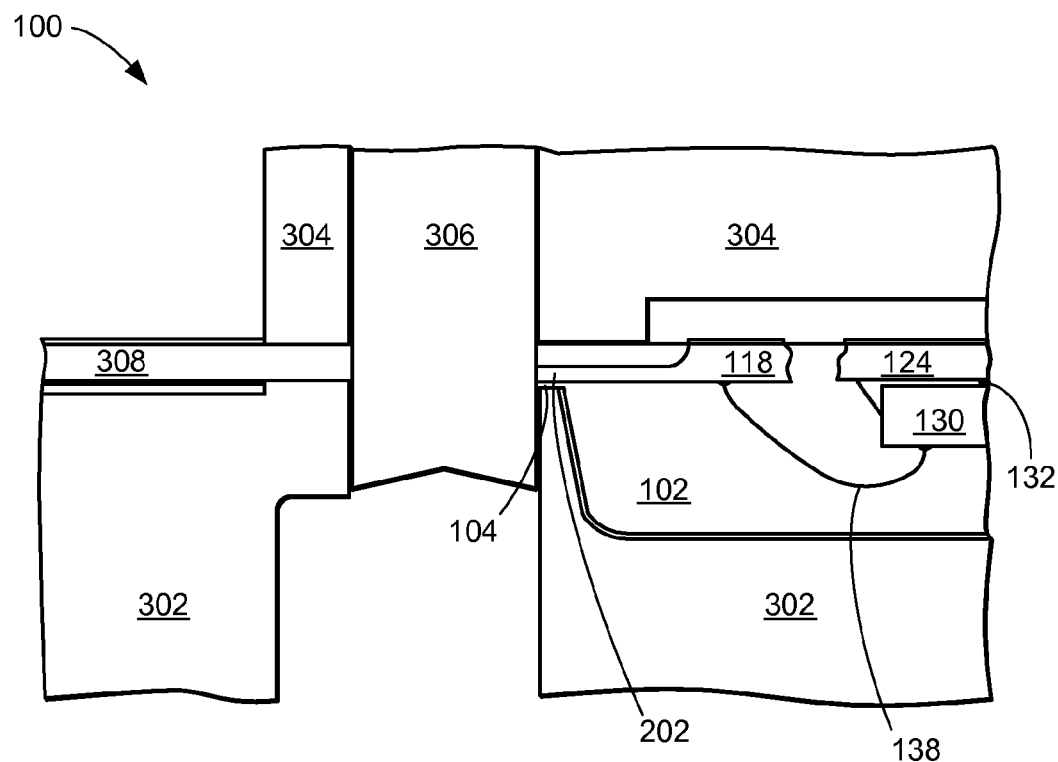
FIG. 3 is a cross-sectional view of the integrated circuit leadless package system in a lead singulation phase.

Referring now to FIG. 3, therein is shown a cross-sectional view of the integrated circuit leadless package system 100 in a lead singulation phase. The thin encapsulant region 104 of the encapsulant 102 is clamped by a cut die insert 302 and a stripper 304. The cut die insert 302 and the stripper 304 hold the row-one leads 106 of FIG. 1, the row-two leads 112 of FIG. 1, and the row-three leads 118 in a substantially fixed position. A punch 306 cuts or severs the lead extensions 202 from a tie bar 308 to singulate the row-three leads 118. Similarly, the punch 306 cuts or severs the lead extensions 202 from the tie bar 308 to singulate the row-three leads 118. In a similar manner, the punch 306 cuts or severs a row-one lead extension (not shown) to singulate the row-one leads 106.

The thin encapsulant region 104 may provide a clamping surface formed for the cut die insert 302. The cut die insert 302 clamps or hold the row-one leads 106 and the lead extensions 202 by clamping the thin encapsulant region 104 of the encapsulant 102. A portion of the cut die insert 302 is formed of a predetermined planar dimension substantially matching a planar dimension of the clamping surface provided by the thin encapsulant region 104. The clamping surface abuts a cut region formed by an extent of a cut path of the punch 306. The cut die insert 302 provides support to the encapsulant 102 and may also serve as a guide for the punch 306.

The encapsulant 102 covers the lead extensions 202 and the row-one leads 106 providing protection from deformation by the punch 306. The punch 306 cuts through the encapsulant 102, the lead extensions 202, the row-one lead extension, and the thin encapsulant region 104. Pressure from the punch 306 imparts forces in the lead extensions 202 and the row-one leads 106. The forces tend to deform, including compress and spread, the lead extensions 202 and the row-one leads 106. The thin encapsulant region 104 and the cut die insert 302 provide structural integrity and alignment to the lead extensions 202 and the row-one leads 106 preventing deformation of the lead extensions 202 and the row-one leads 106.

The encapsulant 102 also provides structural integrity and protection to the integrated circuit die 130, the die attach paddle 124, the row-three connections 138 as well as the row-two connections 136 of FIG. 1 and the row-one connections 134 of FIG. 1. For illustrative purposes, the row-three leads 118 are shown although it is understood that any number of rows or leads may be used. Further, for illustrative purposes, the row-three leads are shown although the row-three leads are optional.

Figure 4:
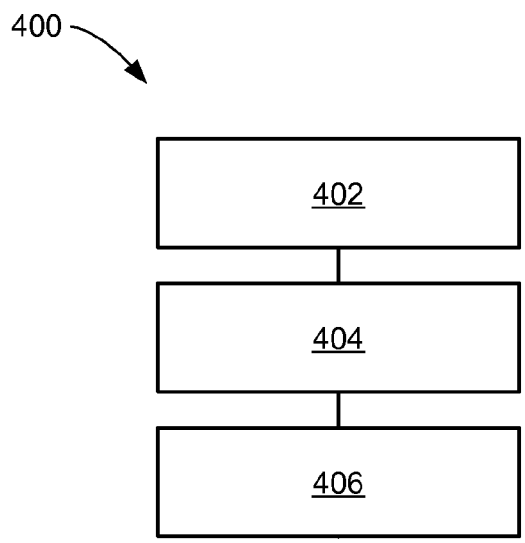
FIG. 4 is a flow chart of an integrated circuit leadless package system for manufacturing the integrated circuit leadless package system in an embodiment of the present invention.

Referring now to FIG. 4 is a flow chart of an integrated circuit leadless package system 400 for manufacturing the integrated circuit leadless package system 100 in an embodiment of the present invention. The system 400 includes forming a lead in a block 402; attaching an integrated circuit die to the lead in a block 404; and applying an encapsulant including a thin encapsulant region with a thinner section over the lead than a section over the integrated circuit die in a block 406.

In greater detail, a method to fabricate the integrated circuit leadless package system 100, in an embodiment of the present invention, is performed as follows:
1. Forming a lead and a lead extension. (FIG. 1)
2. Connecting an integrated circuit die to the lead and the lead extension. (FIG. 1)
3. Forming a protective surface of an encapsulant over the lead and the lead extension having a thin encapsulant region with a thinner section over the lead than a section over the integrated circuit die. (FIG. 1)

It has been discovered that the present invention thus has numerous aspects.

An aspect is that the present invention provides the encapsulant over the flange of the row-one leads. The encapsulant is applied to protect the integrated circuit die, the leads and the electrical connections particularly from environmental factors in the product. The flange of the row-one leads is used as a clamping surface during processing and is provided on the top surface of the row-one leads and the top surface of the lead extensions of the row-two leads and the row-three leads. The encapsulant covers and protects the clamping surface of the flange of the row-one leads during processing such as the singulation process. Protecting the flange of the row-one leads protects the row-one leads and the lead extensions forming the flange of the row-one leads.

It has been discovered that the disclosed structure provides improved lead protection for the row-one leads and the lead extensions of the row-two leads and the row-three leads. The improved protection is most notable for the singulation process during which the row-one leads, the row-two leads and the row-three leads are severed or cut from the tie bar. The tie bar provides structural integrity and substantially fixed positions for the row-one leads, the row-two leads and the row-three leads during processing. The final product requires that the tie bar be removed to singulate or electrically isolate each of the row-one leads, the row-two leads and the row-three leads.

It has also been discovered that the disclosed structure provides a smaller package body size. The no lead or leadless formats for the leads improve density and reduce overall package size and footprint. Further, the multi row leads, including the row-one leads, the row-two leads and the row-three leads, improve the area efficiency for the interconnection of the leads thereby significantly improving the areal density of the overall package. The improved areal density provides much smaller dimensions of the package footprint such that planar dimensions of the package footprint are smaller for the increased number of leads. Yet smaller planar dimensions of the package footprint are provided if the product or next level system requires few or no additional leads to be formed.

Yet another discovery of the disclosed structure is that the disclosed structure provides an improved lead pitch. The thinned regions of the lead extensions and the improved spacing of the row-one leads one to another as well as the row-one leads to the lead extensions, provide for interleaving of the leads. Interleaving of the row-one leads one to another as well as the row-one leads with the lead extensions, provides significantly improved spacing for the leads. The improved lead pitch provides improved area of the overall integrated circuit leadless package system as well as significantly improved routing area for the next level system such as a printed circuit board.

Yet another discovery of the disclosed structure is that a high number of leads are provided for the inputs and the outputs of the integrated circuit die. The improved lead pitch and the improved planar position allow smaller leads with reduced pitch. The smaller leads and reduced pitch provide a significantly higher number of leads within the same or smaller footprint area or planar dimension. The significantly higher number of leads provides additional interconnection between the integrated circuit leadless package system and the next level system such as a printed circuit board. The additional interconnection improves the number and complexity of features and functions for the next level system and the product.

These and other valuable aspects of the present invention consequently further the state of the technology to at least the next level.

Thus, it has been discovered that the integrated circuit leadless package system method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. An integrated circuit leadless package system comprising:
    forming a lead;
    forming a row-two lead next to the lead;
    attaching an integrated circuit die to the lead or the row-two lead; and
    applying an encapsulant including a thin encapsulant region with a thinner section over the lead than a section over the integrated circuit die and the row-two lead, the thin encapsulant region having a planar top surface over and substantially parallel to a flange region of the lead.

2. The system as claimed in claim 1 wherein applying the encapsulant comprises providing a bottom surface of the lead substantially exposed.

3. The system as claimed in claim 1 further comprising forming a row-three lead.

4. The system as claimed in claim 1 wherein attaching an integrated circuit die comprises attaching a connection to the integrated circuit die and the lead.

5. An integrated circuit leadless package system comprising:
    forming a lead and a lead extension;
    forming a row-two lead connected to the lead extension:
    connecting an integrated circuit die to the lead and the lead extension; and
    forming a protective surface of an encapsulant over the lead and the lead extension having a thin encapsulant region with a thinner section over the lead than a section over the integrated circuit die and the row-two lead, the thin encapsulant region having a planar top surface over and substantially parallel to a flange region of the lead.

6. The system as claimed in claim 5 wherein forming the protective surface comprises providing the lead substantially undeformed.

7. The system as claimed in claim 5 further comprising forming a row-three lead nearest a die paddle.

8. The system as claimed in claim 5 wherein forming the protective surface comprises forming a bottom surface of the lead substantially exposed.

9. An integrated circuit leadless package system comprising:
    a lead;
    a row-two lead next to the lead;
    an integrated circuit die attached to the lead or the row-two lead; and
    an encapsulant including a thin encapsulant region with a thinner section over the lead than a section over the integrated circuit die and the row-two lead, the thin encapsulant region having a planar top surface over and substantially parallel to a flange region of the lead.

10. The system as claimed in claim 9 wherein the encapsulant comprises a bottom surface of the lead substantially exposed.

11. The system as claimed in claim 9 further comprising a row-three lead.

12. The system as claimed in claim 9 wherein an integrated circuit die comprises a connection to the integrated circuit die and the lead.

13. The system as claimed in claim 9 wherein:
    the lead is a lead and a lead extension;
    the integrated circuit die is an integrated circuit die connected to the lead and the lead extension; and
    the encapsulant is a protective surface of an encapsulant over the lead and the lead extension having a thin encapsulant region with a thinner section over the lead than a section over the integrated circuit die.

14. The system as claimed in claim 13 wherein the protective surface comprises the lead substantially undeformed.

15. The system as claimed in claim 13 further comprising a row-three lead formed nearest a die paddle.

16. The system as claimed in claim 13 wherein the protective surface comprises a bottom surface of the lead substantially exposed.

* * * * *